(12) United States Patent
Arora et al.

(10) Patent No.: US 7,655,304 B2
(45) Date of Patent: Feb. 2, 2010

(54) COATED SOLDER METAL PARTICLES

(75) Inventors: Sanyogita Arora, North Arlington, NJ (US); Gerard R. Minogue, Yorba Linda, CA (US)

(73) Assignee: Fry's Metals, Inc., South Plainfield, NJ (US)

( * ) Notice: Subject to any disclaimer, the term of this patent is extended or adjusted under 35 U.S.C. 154(b) by 0 days.

(21) Appl. No.: 12/191,710

(22) Filed: Aug. 14, 2008

(65) Prior Publication Data

US 2008/0299394 A1    Dec. 4, 2008

Related U.S. Application Data

(62) Division of application No. 10/888,619, filed on Jul. 9, 2004, now Pat. No. 7,413,771.

(60) Provisional application No. 60/485,893, filed on Jul. 9, 2003.

(51) Int. Cl.
*B32B 5/16* (2006.01)
(52) U.S. Cl. .................... 428/403; 75/313; 148/24; 428/407
(58) Field of Classification Search ................ 428/403, 428/407; 148/24; 75/313
See application file for complete search history.

(56) References Cited

U.S. PATENT DOCUMENTS

| | | | |
|---|---|---|---|
| 4,298,407 A | 11/1981 | Taylor | |
| 4,318,747 A | 3/1982 | Ishijima et al. | |
| 4,455,362 A | 6/1984 | Naoi et al. | |
| 4,619,715 A | 10/1986 | Hwang | |
| 4,636,451 A | 1/1987 | Matkin et al. | |
| 4,719,164 A | 1/1988 | Podszun et al. | |
| 5,110,384 A | 5/1992 | Dudek et al. | |
| 5,272,007 A | 12/1993 | Jenkinson et al. | |
| 5,376,403 A | 12/1994 | Capote et al. | |
| 5,571,455 A | 11/1996 | Higuchi | |
| 5,817,374 A | 10/1998 | Detig et al. | |
| 5,885,369 A | 3/1999 | Hanawa et al. | |
| 5,922,403 A | 7/1999 | Tecle | |
| 5,976,337 A | 11/1999 | Korinko et al. | |
| 5,981,043 A | 11/1999 | Murakami et al. | |
| 6,025,258 A | 2/2000 | Ochiai et al. | |
| 6,153,348 A | 11/2000 | Kydd et al. | |
| 6,156,237 A | 12/2000 | Kubota et al. | |
| 6,157,789 A | 12/2000 | Kamada et al. | |
| 6,337,028 B1 | 1/2002 | Masuko et al. | |
| 6,345,718 B1 | 2/2002 | Minogue | |
| 6,479,143 B1 * | 11/2002 | Tamaru et al. | 428/364 |
| 6,524,758 B2 | 2/2003 | Eberlein et al. | |
| 6,579,652 B1 | 6/2003 | Detig et al. | |
| 6,781,612 B1 | 8/2004 | Detig | |
| 6,815,130 B2 | 11/2004 | Eberlein et al. | |
| 6,876,370 B2 | 4/2005 | Detig | |
| 7,157,193 B2 | 1/2007 | Kawamura et al. | |
| 7,352,353 B2 * | 4/2008 | Albert et al. | 345/107 |
| 7,413,771 B2 * | 8/2008 | Arora et al. | 427/216 |
| 2006/0151580 A1 * | 7/2006 | Flint | 228/244 |

FOREIGN PATENT DOCUMENTS

| | | |
|---|---|---|
| WO | 02/48980 A1 | 6/2002 |
| WO | 02/063397 A1 | 8/2002 |
| WO | 02/071465 A1 | 9/2002 |
| WO | 2005/007919 A2 | 1/2005 |

OTHER PUBLICATIONS

International Search Report, PCT/US2004/022079, dated May 12, 2005, 2 pages.
Written Opinion, PCT/US2004/022079, dated May 12, 2005, 3 pages.
International Preliminary Report on Patentability, PCT/US2004/022079, dated Jan. 9, 2006, 4 pages.

* cited by examiner

*Primary Examiner*—H. (Holly) T Le
(74) *Attorney, Agent, or Firm*—Senniger Powers LLP

(57) ABSTRACT

A method for preparing particles to retain a charge such that the particles are rendered electrostatically or electrokinetically mobile. The method involves coating the particles with a coating medium which facilitates attachment of a charge director material, and contacting the particles with the coating medium thereon with a charge director medium to impart a positive or negative charge thereto and thereby render the particles electrostatically or electrokinetically mobile. Electrostatically and electrokinetically mobile particles for use in an electrostatic or electrokinetic deposition process. The particles include a coating medium and a charge director on particle bodies.

11 Claims, No Drawings

COATED SOLDER METAL PARTICLES

CROSS REFERENCE TO RELATED APPLICATIONS

This application is a divisional of U.S. non-provisional application Ser. No. 10/888,916, filed Jul. 9, 2004, which claims priority to provisional application Ser. No. 60/485,893, filed Jul. 9, 2003, issued Aug. 19, 2008 as U.S. Pat. No. 7,413,771, the entire disclosures of which are incorporated herein by reference.

FIELD OF THE INVENTION

The present invention relates to a method for preparing particles including powders and larger particles for patterning by electrostatic or electrokinetic means, such as patterning of metal particles in the manufacture of electronic devices.

BACKGROUND OF THE INVENTION

In a variety of applications, it is desirable to apply organic or inorganic particles, such as metal particles and metal powders, to substrates in a predetermined pattern. One such application is in the field of printed wiring boards, where solder paste containing metal powder has been applied to a substrate through a stainless steel or electroformed stencil which defines a pattern, or by screen printing.

Many industrial solder and other metal powders are not stable at room temperature for prolonged periods in that they are subject to oxidation.

SUMMARY OF THE INVENTION

Among the several aspects of the invention is to provide particles for electrokinetic or electrostatic deposition in a pattern on a substrate. Another aspect is to provide metal particles which are resistant to oxidation and stable over prolonged storage periods at room temperature.

Briefly, therefore, the invention is directed to a method for preparing particles to retain a charge such that the particles are rendered electrostatically or electrokinetically mobile. The method comprise coating particles with a coating medium which facilitates attachment of a charge director material, wherein the coating medium is selected from the group consisting of anionic species, non-ionic species, cationic species, acids, bases, and mixtures thereof, to yield particles with the coating medium thereon; and contacting the particles with the coating medium thereon with a charge director medium to impart a positive or negative charge thereto and thereby render the particles electrostatically or electrokinetically mobile.

In another aspect the invention is directed to electrostatically or electrokinetically mobile particles for use in an electrostatic or electrokinetic deposition process. The particles comprise the particle bodies; a coating medium on the particle bodies which facilitates attachment thereto of a charge director material, wherein the coating medium is selected from the group consisting of anionic species, non-ionic species, cationic species, acids, bases, and mixtures thereof; and a charge director material on the coating medium wherein the charge director material has a positive or negative charge and thereby renders the particle bodies electrostatically or electrokinetically mobile.

Other aspects and features of the invention will be in part apparent, and in part described hereafter.

DETAILED DESCRIPTION OF THE EMBODIMENT(S) OF THE INVENTION

In accordance with this invention, organic or inorganic particles are coated in order to render them amenable to treatment with a charge director, so that the particles can thereby be rendered electrokinetically or electrostatically mobile. In one preferred embodiment, the particles are a powder selected from among the metals/alloys Sn, Sn/Pb, Sn/Ag/Cu, Sn/Ag, Cu, Sn/Ag/Bi, Sn/Bi, Sn/Pb/Bi or others.

The particle size is typically between about 0.5 microns and 1 mm. In one embodiment, the particles are powder particles having an average diameter between about 0.5 and about 50 microns. In another embodiment, they are powder particles have an average diameter between about 1 and about 100 microns. One preferred powder is a Type 6 powder with a size distribution primarily between about 10 and about 20 microns. The particles are alternatively mid-sized particles having an average particle size between about 50 and about 500 microns. In a further alternative, they are relatively larger spheres of inorganic material having an average size greater than about 100 microns, such as between 100 microns and 1 mm. These are, for example, solder metal spheres. For certain applications, organometallic particles may be used.

In carrying out the invention, the particles are coated with a material selected from among ionic surfactant materials, non-ionic materials such as non-ionic polymers, organic acids and/or bases, and mixtures thereof. Depending on how the coating is physically carried out, the coating medium may also contain a solvent. That is, if coating is accomplished by immersion in a solution, spraying with a solution, or exposure to a solution in a fluidized bed, a solvent is needed. On the other hand, if the coating is accomplished by a plasma coating process or the like, no solvent is required.

Among the surfactant materials which are suitable for coating particles according to this invention are the following cationic materials:

Stearamidopropyl diethanolamine available from Inolex Chemical Co. under the trade designation Lexamine 22.

C16-C18 monoalkyl amines such as hydrogenated tallow-alkylamine available from Akzo Noel under the trade designation Armeen HT.

N-Myristoyl sarcosine available from Hampshire Chemical Corporation under the trade designation Hamposyl M.

N-Stearoyl sarcosine available from Hampshire Chemical Corporation under the trade designation Hamposyl S.

Mixture of N-Myristoyl sarcosine and N-Stearoyl sarcosine available from Hampshire Chemical Corporation under the trade designation Hamposyl MS.

N-(1,3-dimethylbutyl)-N'-phenyl-P-phenylenediamine available from Crompton Corporation under the trade designation Flexzone 7F (antioxidant 4020).

N,N'-hexane-1,6-diylbis(3-(3,5-di-tert-butyl-4-hydroxphenylpropionamide)) available from Ciba under the trade designation Irganox 1098.

Amino-based silicone copolyol surfactant available from Lambent under the trade designation Lambent Amine PD.

Stearamidopropyl diethanolamine available from Inolex Chemical Co. under the trade designation Lexamine 22.

Amides, Polyamide, and Polyamide resins for example Versamid 940 polyamide resin available from Cognis.

Also among the surfactant materials which are suitable for coating particles according to this invention are the following anionic materials:

N-Laurylethylenediaminetriacetic acid available from Hampshire Chemical Corporation under the trade designation LED3A Acid.

Glyceryl Stearate SE containing potassium and free glycerol.

Behenic Acid (docosanoic acid) available from Croda under trade the designation Crodacid B.

Fatty alcohol/phosphate ester/ethoxylate mixture [alcohols C16-18/1-hexadecanol hydrogen phosphate/polyoxyethylene (1) cetyl ether phosphate] available from Croda under the trade designation Crodaphos CES.

Additional suitable materials include the following polymeric materials:

Styrene acrylic acid copolymer available under the designation Joncryl from S.C. Johnson Co.

Ethylene acrylic acid co-polymers A-C 540, 540A, 580, 5120, 5180 available from Allied Signal Corporation.

Palmitic acid, stearic acid, and other fatty acids and mixture thereof.

Propylene acrylic acid copolymer.

Rosins and modified rosins for example Gum rosin, hydrogenated rosins, fumaric and maleic acid adducts of rosins etc.

The foregoing coating materials render the coated particles amenable to treatment with a charge director, so that the particles can be treated with a charge director to render them electrokinetically or electrostatically mobile.

This coating provides a surface characterized as, for example, a very hydroxyl surface or a very acidic surface with which a subsequently applied charge director can react.

In selecting a coating material, if the particles are metal particles to be used as a solder, it is preferable to select one which provides a fluxing function in the eventual powder when it is used as a solder.

Among the organic acids which are suitable for coating particles according to this invention are aliphatic and aromatic acids, mono, di, tricarboxylic acids and also amino acids, sulfonic, sulfamic, phosphinic, phosphonic acids etc., including the following: mono and dicarboxylic acids with a C backbone length between $C_1$ and $C_{20}$ such as adipic acid, citric acid, ascorbic acid, succinic acid, malic acid, malonic acid.

Among the organic bases which are suitable for coating particles according to this invention are the following: saturated and unsaturated, aliphatic and aromatic amines for example primary, secondary, tertiary amines, ethyl amine, tertiary butyl amine, propylamines, alkanolamines, alkylamines, Anisidine, N-phenylbenzylamine, N-Phenyldiethanolamine, Diphenylguanidine, 2-Aminobenzotrifluoride, etc.

The polar organic solvent, when used, is selected from among those solvents in which the coating compositions are soluble. These solvents include aromatic and aliphatic compositions; for example, alcohols such as methanol, ethanol, isopropanol, butanol, other alcohols, ketones, glycols, glycol ethers, esters, toluene, benzene, and mixtures thereof.

In preparing a surfactant solution, the surfactant or polymer content in one embodiment is between about 0.05 and about 10% by weight, preferably between about 0.1 and about 1% by weight. The organic solvent content is between about 99.95 to 90% by weight, preferably between about 99.9 and about 99% by weight.

In preparing an organic acid or base solution, the acid or base content in one embodiment is between about 0.05 and about 10% by weight, preferably between about 0.5 and about 2% by weight. The organic solvent content is between about 99.95 to 90% by weight, preferably between about 99.5 and about 98% by weight.

The particles are introduced into the coating mixture in an amount of up to about 99.9 wt %. In a preferred embodiment, the particles are introduced in an amount between about 85% and about 99 wt %. The method of introduction is selected from among ultrasonication, fluidized bed coating, low-shear impeller mixing, ball milling, and bead milling.

After coating the particles, the supernatant is decanted off and the particles are washed at least once. In one embodiment, the particles are washed between two and five times with a neutral high dielectric organic liquid such as isoparaffin distributed by Exxon Chemical of Houston, Tex. under the trade name Isopar. This yields prepared solder particles ready for use in patterning. Also, due to an oxygen diffusion barrier created by the coating, the particles resist oxidation and are stable for prolonged storage periods at room temperature.

As an alternative to immersion coating of the particles as described above, they may be coated by other methods such as fluidized bed coating, spray coating, pan coating, rotary coating, roll coating, plasma coating, or solution coating.

The foregoing process yields particles which have an electrically insulative coating and which are capable of holding a static charge. For solder powder, the coating is capable of melting away at soldering temperatures, and in some instances the coating serves a fluxing function during soldering.

As noted above, the coating medium may contain a mixture of two or more of the species mentioned. In one example, the primary coating medium is anionic or cationic, with a counter species (cationic or anionic) used for controlling the overall charge.

One especially preferred embodiment within the scope of those described above employs one of the several ionic species (anionic or cationic) bound to a metal particle surface. The ionic species is selected to complement the charge director which is to then be applied for purposes of rendering the particles electrostatically or electrokinetically mobile.

To use the particles in an electrostatic or electrokinetic process such as that disclosed in the U.S. patent application filed Jul. 9, 2004 entitled DEPOSITION AND PATTERNING PROCESS (US 2005/0106329 A1), the entire disclosure of which is expressly incorporated herein by reference, the particles are introduced into a solution containing an electrolyte or polyelectrolyte, also known as a charge director. Examples of suitable electrolytes/polyelectrolytes include, but are not limited to, the following:

Polyvinyl lecithin solution available from HP Compaq

Phosphated monoacid diglycerides available under the trade name NPHOS

Sodium dodecyl sulfate (SDS)

Sodium lauryl sulfate

Cobalt nitrate

Perfluoro pentanoic, octanoic, decanoic acids and similar species

Perfluoro carboxylic acids (perfluoro sebacic, suberic, succinic acids)

Sodium and calcium fatty acid salts

Sulfates of ethoxylated alcohols

Ammonium lauryl sulfate

Sodium allyl sulfates and sulfonates

Barium petronate, optionally modified by perfusion with distilled water

Quaternary ammonia electrolytes and polyelectrolytes such as allyl methyl ammonium chloride, hexadecyl ammonium chloride, and dodecyl trimethyl ammonium chloride.

This thereby yields electrostatically or electrokinetically mobile particles for use in an electrostatic or electrokinetic deposition process. The particles comprise the particle bodies; the above-described coating medium on the particle bodies which facilitates attachment thereto of a charge director material, wherein the coating medium is selected from the group consisting of anionic species, non-ionic species, cationic species, acids, bases, and mixtures thereof; and the above-described charge director material on the coating medium wherein the charge director material has a positive or negative charge and thereby renders the particle bodies electrostatically or electrokinetically mobile.

Thereafter, the particles are dried by pan drying, spray drying, or other suitable means. The function of the electrolyte or polyelectrolyte is to facilitate maintenance of electrical charge so the particles will respond in desired manner in the presence of an electrical field.

In preparation for printing, the particles are combined and wetted with a liquid having suitable dielectric properties. One example of such a liquid is the Isopar product. Another example is a product available from 3-M Corporation under the trade name Fluorinert. The combined particles and liquid ranges from about 2% by weight particles up to about 90% by weight particles. The particles constitute from about 2 to about 60% of the mixture on a volume basis.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense. The foregoing relates to a limited number of embodiments that have been provided for illustration purposes only. It is intended that the scope of invention is defined by the appended claims and there are modifications of the above embodiments that do not depart from the scope of the invention.

What is claimed is:

1. Electrostatically or electrokinetically mobile solder metal particles for use in an electrostatic or electrokinetic deposition process, the solder metal particles comprising:
    solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;
    a coating medium on the particle bodies which facilitates attachment thereto of a charge director material, wherein the coating medium is a polymeric material; and
    a charge director material on the coating medium wherein the charge director material has a positive or negative charge and thereby renders the solder metal particle bodies electrostatically or electrokinetically mobile.

2. The solder metal particles of claim 1 wherein the coating medium comprises a polymeric material selected from the group consisting of a) styrene acrylic acid copolymer, b) ethylene acrylic acid co-polymers, c) propylene acrylic acid copolymer, and d) mixtures thereof.

3. Electrostatically or electrokinetically mobile solder metal particles for use in an electrostatic or electrokinetic deposition process, the solder metal particles comprising:
    solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;
    a coating medium on the particle bodies which facilitates attachment thereto of a charge director material, wherein the coating medium is selected from the group consisting of a) stearamidopropyl diethanolamine, b) C16-C18 monoalkyl amines, c) hydrogenated tallowalkylamine, d) N-Myristoyl sarcosine, e) N-Stearoyl sarcosine, f) N-(1,3-dimethylbutyl)-N'-phenyl-P-phenylenediamine, g) N,N'-hexane-1,6-diylbis(3-(3,5-di-tert-butyl-4-hydroxphenylpropionamide)), h) amino-based silicone copolyol surfactants, and i) mixtures thereof; and
    a charge director material on the coating medium wherein the charge director material has a positive or negative charge and thereby renders the solder metal particle bodies electrostatically or electrokinetically mobile.

4. Electrostatically or electrokinetically mobile solder metal particles for use in an electrostatic or electrokinetic deposition process, the solder metal particles comprising:
    solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;
    a coating medium on the particle bodies which facilitates attachment thereto of a charge director material, wherein the coating medium is selected from the group consisting of amides, polyamides, and polyamide resins; and
    a charge director material on the coating medium wherein the charge director material has a positive or negative charge and thereby renders the solder metal particle bodies electrostatically or electrokinetically mobile.

5. Electrostatically or electrokinetically mobile solder metal particles for use in an electrostatic or electrokinetic deposition process, the solder metal particles comprising:
    solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;
    a coating medium on the particle bodies which facilitates attachment thereto of a charge director material, wherein the coating medium is selected from the group consisting of a) N-Laurylethylenediaminetriacetic acid, b) Glyceryl Stearate SE containing potassium and free glycerol, c) Stearamidopropyl diethanolamine, d) Behenic Acid (docosanoic acid), e) a fatty alcohol/phosphate ester/ethoxylate mixture, and f) mixtures thereof; and
    a charge director material on the coating medium wherein the charge director material has a positive or negative charge and thereby renders the solder metal particle bodies electrostatically or electrokinetically mobile.

6. Electrostatically or electrokinetically mobile solder metal particles for use in an electrostatic or electrokinetic deposition process, the solder metal particles comprising:
    solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;
    a coating medium on the particle bodies which facilitates attachment thereto of a charge director material, wherein the coating medium is selected from the group consisting of rosins and modified rosins; and
    a charge director material on the coating medium wherein the charge director material has a positive or negative charge and thereby renders the solder metal particle bodies electrostatically or electrokinetically mobile.

7. The solder metal particles of claim 1 wherein the coating medium comprises a material selected from the group consisting of gum rosin, hydrogenated rosins, fumaric adducts of rosins, and maleic acid adducts of rosins.

8. Electrostatically or electrokinetically mobile solder metal particles for use in an electrostatic or electrokinetic deposition process, the solder metal particles comprising:

solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;

a coating medium on the particle bodies which facilitates attachment thereto of a charge director material, wherein the coating medium is selected from the group consisting of a) tricarboxylic acids, b) amino acids, c) sulfonic acids, d) sulfamic acids, e) phosphinic acids, f) phosphonic acids, and g) mixtures thereof; and a charge director material on the coating medium wherein the charge director material has a positive or negative charge and thereby renders the solder metal particle bodies electrostatically or electrokinetically mobile.

9. Electrostatically or electrokinetically mobile solder metal particles for use in an electrostatic or electrokinetic deposition process, the solder metal particles comprising:

solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;

a coating medium on the particle bodies which facilitates attachment thereto of a charge director material, wherein the coating medium is a mono- or di-carboxylic acid selected from the group consisting of adipic acid, citric acid, ascorbic acid, succinic acid, malic acid, malonic acid, palmitic acid, stearic acid, and mixtures thereof; and a charge director material on the coating medium wherein the charge director material has a positive or negative charge and thereby renders the solder metal particle bodies electrostatically or electrokinetically mobile.

10. Electrostatically or electrokinetically mobile solder metal particles for use in an electrostatic or electrokinetic deposition process, the solder metal particles comprising:

solder metal particle bodies consisting essentially of a metal/alloy selected from the group consisting of Sn, Sn/Pb, Sn/Ag/Cu, Sn/Ag, Cu, Sn/Ag/Bi, Sn/Bi, and Sn/Pb/Bi;

a coating medium on the particle bodies which facilitates attachment thereto of a charge director material, wherein the coating medium is an aromatic amine or an aliphatic amine selected from the group consisting of a) primary amines, b) secondary amines, c) tertiary amines, and d) mixtures thereof; and a charge director material on the coating medium wherein the charge director material has a positive or negative charge and thereby renders the solder metal particle bodies electrostatically or electrokinetically mobile.

11. The particles of claim 10 wherein the coating medium comprises a material selected from the group consisting of a) ethyl amine, b) tertiary butyl amine, c) propylamines, d) alkanolamines, e) anisidine, f) N-phenylbenzylamine, g) N-phenyldiethanolamine, h) diphenylguanidine, i) 2-Aminobenzotrifluoride, and j) mixtures thereof.

* * * * *